United States Patent
Hsieh et al.

(10) Patent No.: US 10,945,140 B1
(45) Date of Patent: Mar. 9, 2021

(54) AUTOMATED ANTENNA TESTING DEVICE

(71) Applicant: Siliconware Precision Industries Co., Ltd., Taichung (TW)

(72) Inventors: Cheng-Tsai Hsieh, Taichung (TW); Cheng-Shao Chen, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 16/594,714

(22) Filed: Oct. 7, 2019

(30) Foreign Application Priority Data

Sep. 3, 2019 (TW) .................................. 108131694

(51) Int. Cl.
| | |
|---|---|
| *H04B 17/00* | (2015.01) |
| *H04W 24/00* | (2009.01) |
| *G01R 31/28* | (2006.01) |
| *H04B 17/20* | (2015.01) |
| *H01Q 1/24* | (2006.01) |
| *H04B 17/16* | (2015.01) |
| *H01Q 1/36* | (2006.01) |

(52) U.S. Cl.
CPC ........ *H04W 24/00* (2013.01); *G01R 31/2893* (2013.01); *H01Q 1/241* (2013.01); *H01Q 1/36* (2013.01); *H04B 17/16* (2015.01); *H04B 17/20* (2015.01)

(58) Field of Classification Search
CPC ....... H04W 24/00; H04B 17/16; H04B 17/20; H04B 17/29; G01R 1/04; G01R 31/002; G01R 31/28; G01R 31/2893; H01Q 1/241; H01Q 1/36
See application file for complete search history.

(56) References Cited

U.S. PATENT DOCUMENTS

| | | | | |
|---|---|---|---|---|
| 2014/0141726 | A1* | 5/2014 | Schlub | G01R 29/0871 455/67.12 |
| 2015/0355231 | A1* | 12/2015 | Rogel-Favila | G01R 31/2801 324/750.13 |

\* cited by examiner

*Primary Examiner* — Tuan Pham
(74) *Attorney, Agent, or Firm* — Mintz Levin Cohn Ferris Glovsky and Popeo, P.C.; Peter F. Corless; Steven M. Jensen

(57) ABSTRACT

An automated antenna testing device is disclosed. A carrying stand for objects-to-be-tested to be carried thereon, and an antenna stand corresponding to the carrying stand are installed in a receiving space of a cavity part on a machine part, and a conveyance device for moving the objects-to-be-tested to the carrying stand is installed on the machine part. The conveyance device and the cavity part are installed independently, therefore, an OTA testing environment can be prevented from being affected by external factors.

16 Claims, 7 Drawing Sheets

AUTOMATED ANTENNA TESTING DEVICE

CROSS-REFERENCE TO RELATED APPLICATIONS

This application claims priority to Taiwanese Application Serial No. 108131694, filed on Sep. 3, 2019. The entirety of the application is hereby incorporated by reference herein and made a part of this specification.

BACKGROUND

1. Technical Field

The present disclosure relates to testing devices, and, more particularly, to an automated antenna testing device applicable to a testing operation over the air.

2. Description of the Prior Art

Current communication transmission is in fourth generation (4G), and is under development toward fifth generation (5G), which provides greater wireless transmission bandwidth, from 28 GHz to 52.6 GHz (3gpp R15), even to as high as 73 GHz.

Compared to the current 4G antenna testing, which is conducted at a system end (such as mobile phones, tablet personal computers etc.), the 5G antenna testing has to be conducted at a packaging and testing end, since the mmWave band has been changed to Antenna in Package (AiP) packaging design.

Currently, the electric testing device used by a packaging and testing factory during a packaging and testing stage employs a metal compressing fixture to compress a chip-to-be-tested. However, the metal compressing fixture induces a metal shielding effect, which will interfere the antenna. Therefore, the antenna cannot be tested in an over the air (OTA) testing environment.

Therefore, how to design an automated antenna testing device that is applicable in an OTA testing environment, meets the antenna testing requirements, and is compatible with other processes is becoming an urgent issue in the art.

SUMMARY

In view of the drawbacks of the prior art, the present disclosure provides an automated antenna testing device, comprising: a machine part; a cavity part installed on the machine part and having a receiving space; a carrying stand installed in the receiving space, for objects-to-be-tested to be carried thereon; an antenna stand installed in the receiving space and corresponding to the carrying stand, for an antenna to be installed thereon that receives an signal from the objects-to-be-tested or transmits an signal to the objects-to-be-tested; and a conveyance device installed on the machine part and configured for moving the objects-to-be-tested to the carrying stand, wherein the conveyance device and the cavity part are installed independently.

In an embodiment, an active region is formed in the receiving space between the carrying stand and the antenna stand and is a seamless region.

In an embodiment, the conveyance device comprises a robotic arm configured for picking and placing the objects-to-be-tested on the carrying stand. In another embodiment, the robotic arm absorbs and secures the objects-to-be-tested to move the objects-to-be-tested. In yet another embodiment, the conveyance device comprises a plurality of picking and placing parts installed on the robotic arm, and the robotic arm drives one of the picking and placing parts to absorb one of the objects-to-be-tested away from the carrying stand, and drives another one of the picking and placing parts to place another one of the objects-to-be-tested on the carrying stand.

In an embodiment, the cavity part is closed.

In an embodiment, an active region is formed in the receiving space between the carrying stand and the antenna stand, and an inactive region in the receiving space defined to be adjacent to the active region.

In an embodiment, the cavity part comprises an opening being in communication with the receiving space and corresponding to the inactive region, allowing the conveyance device to access the cavity part therethrough. In another embodiment, the opening has unparallel first and second channels in communication with each other, the conveyance device accesses the cavity part through the first channel, and the second channel allows the conveyance device to move in the cavity part. In yet another embodiment, the automated antenna testing device further comprises a cover configured for covering the opening. In still another embodiment, the automated antenna testing device further comprises an actuation device installed outside the cavity part, connected to the cover, and configured for moving the cover. In a further embodiment, the actuation device comprises at least one pneumatic component connected to the cover and configured for moving the cover close to or away from the opening.

In an embodiment, an active region is formed in the receiving space between the carrying stand and the antenna stand, and the active region of the cavity part does not comprise metal.

In the automated antenna testing device according to the present disclosure, the cavity part and the conveyance device are designed independently. Therefore, the OTA testing environment will not be interfered, the OTA testing can be conducted automatically, and the yield is increased.

In the automated antenna testing device according to the present disclosure, both the conveyance device and the actuation device access the cavity part through the inactive region. Therefore, no metal or other objects that will affect the antenna testing will exist in the active region and the antenna testing will not be interfered.

DETAILED DESCRIPTION

Figure 1A:
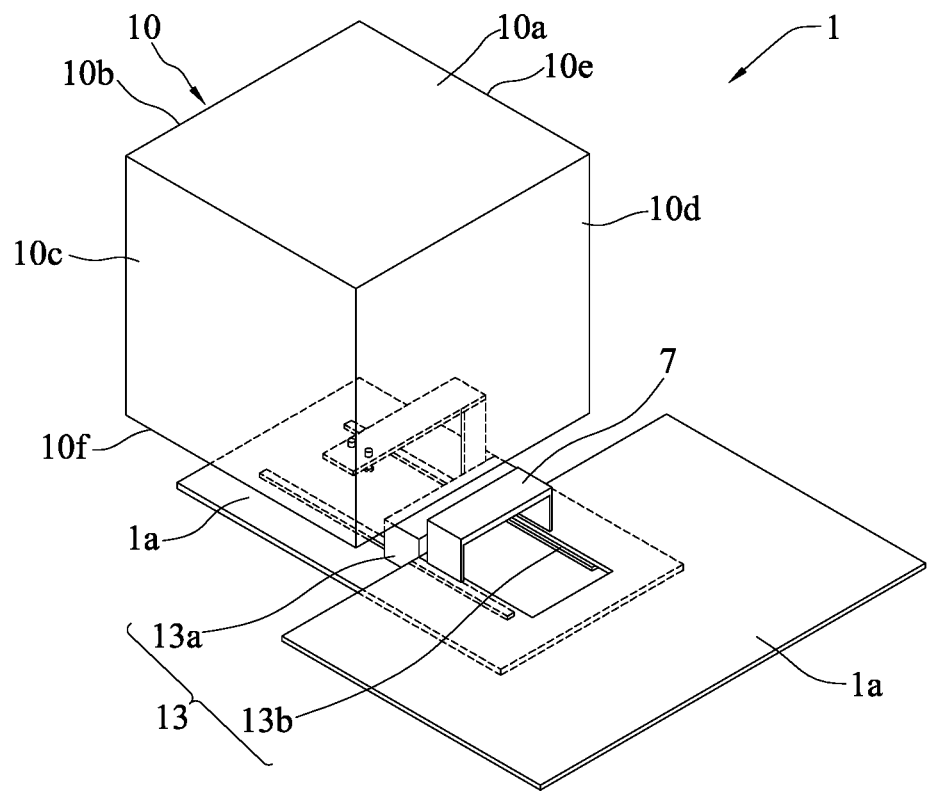
FIG. 1A is a perspective view of a portion of an automated antenna testing device according to the present disclosure.
Figure 1B:
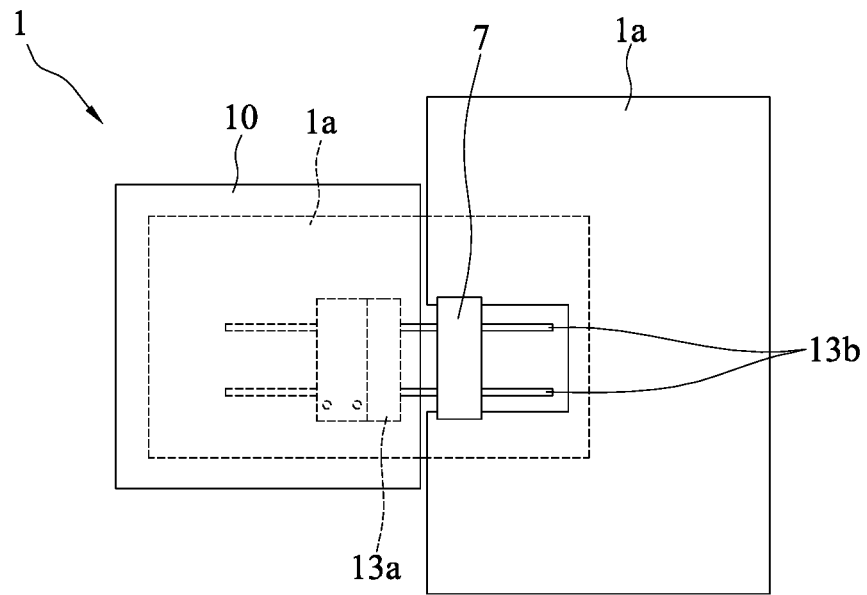
FIG. 1B is a top view of a portion of an automated antenna testing device according to the present disclosure.

The following illustrative embodiments are provided to illustrate the disclosure of the present disclosure, these and other advantages and effects can be apparently understood by those in the art after reading the disclosure of this specification.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and objectives achieved by the present disclosure, any modifications, changes or adjustments to the structures, ratio relationships or sizes, are to be construed as fall within the range covered by the technical contents disclosed herein. Meanwhile, terms, such as "front," "back," "left," "right," "above," "below," "first," "second," "one," and the like, are for illustrative purposes only, and are not meant to limit the range implementable by the present disclosure. Any changes or adjustments made to their relative relationships, without modifying the substantial technical contents, are also to be construed as within the range implementable by the present disclosure.

FIGS. 1A to 1E are schematic diagrams of an automated antenna testing device 1 according to the present disclosure. The automated antenna testing device 1 comprises a machine part 1a, a cavity part 10, a cover 11, a carrying stand 12, an antenna stand 19, a conveyance device 13 and an actuation device 14 (detailed in FIGS. 3A and 3B).

In an embodiment, the automated antenna testing device 1 employs an over the air (OTA) testing environment.

The machine part 1a is a supporting structure of the automated antenna testing device 1, and can be designed to have interior and exterior appearances on demands, including shelfs, frames, stands or other suitable structures, to support the cavity part 10, the conveyance device 13 and the actuation device 14. The drawing shows a portion of the machine part 1.

In an embodiment, the machine part 1a is provided with a carrying plate 7, for a plurality of objects-to-be-tested 8 to be placed thereon, for facilitating the automation of production lines. In an embodiment, the objects-to-be-tested 8 are electronic components, such as an active element (e.g., a semiconductor chip), a passive element (e.g., a resistor, a capacitor and an inductor), a packaging component, or a combination thereof. In another embodiment, the packaging component comprises a substrate, a chip disposed on the substrate, and an encapsulation layer encapsulating the chip. In yet another embodiment, the objects-to-be-tested 8 are components having an antenna structure.

Figure 1C:
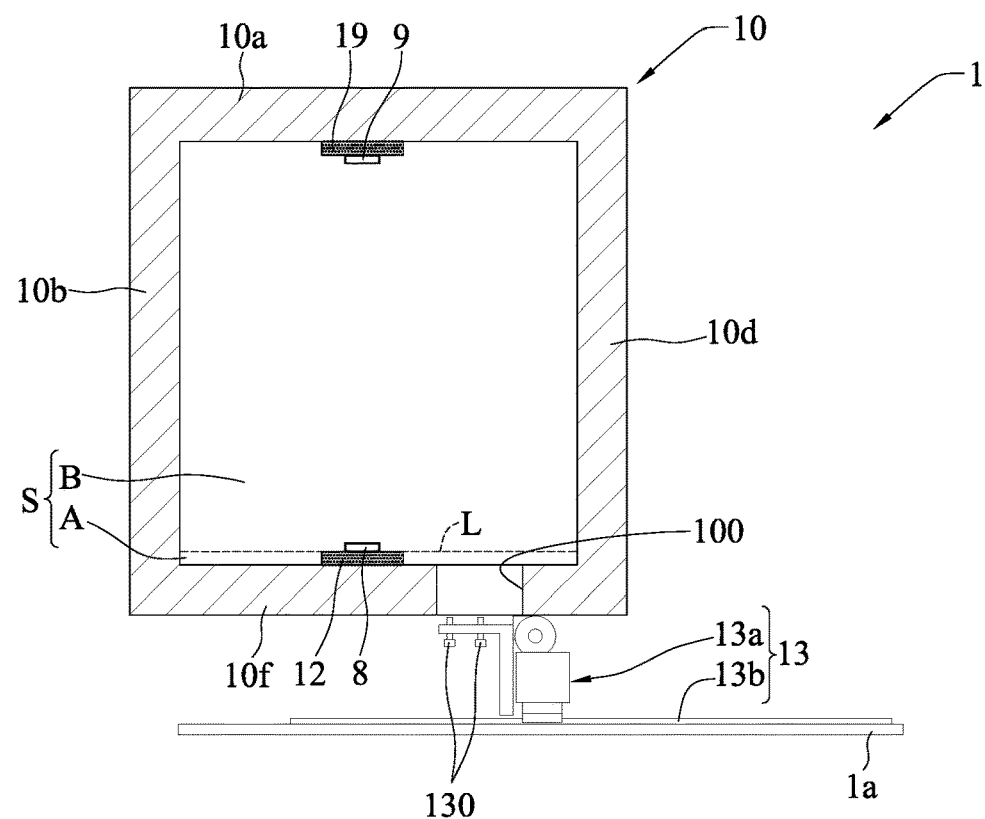
FIG. 1C is a cross-sectional view of a portion of an automated antenna testing device according to the present disclosure.

The cavity part 10 is disposed on the machine part 1a, and has a receiving space S and an opening 100 in communication with the receiving space S, as shown in FIG. 1C. The receiving space S is defined with an inactive region A adjacent to and corresponding to the opening 100 and an active region B adjacent to the inactive region A.

In an embodiment, the cavity part 10 is composed of six approximately rectangular boards 10a, 10b, 10c, 10d, 10e and 10f, and the receiving space S is formed among the boards 10a, 10b, 10c, 10d, 10e and 10f. In another embodiment, the opening 100 is formed on the lower board 10f (i.e., a bottom board). In yet another embodiment, the cavity part 10 and the receiving space S are in other forms.

The carrying stand 12 is disposed within the inactive region A of the cavity part 10 for carrying and locating the objects-to-be-tested 8 within the inactive region A. A top surface of the carrying stand 12 is used as a base surface L to define a space under the base surface L to be used as the inactive region A, and another space above the base surface L to be used as the active region B. In other words, the active region B is formed between the carrying stand 12 and the antenna stand 19.

In an embodiment, the carrying stand 12 is a testing stand having associated circuits arranged therein and electrically connected to the objects-to-be-tested 8.

The carrying stand 12 is disposed at the lower board 10f (i.e., the bottom board), and is exposed from a surface of the lower board 10f (i.e., the bottom board).

Figure 1D:
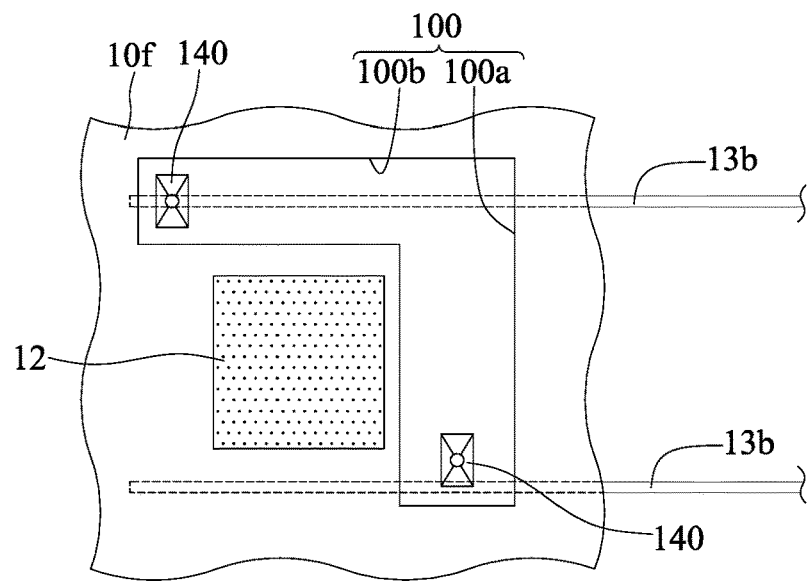
FIG. 1D is a top view of a portion of an automated antenna testing device according to the present disclosure.
Figure 1E:
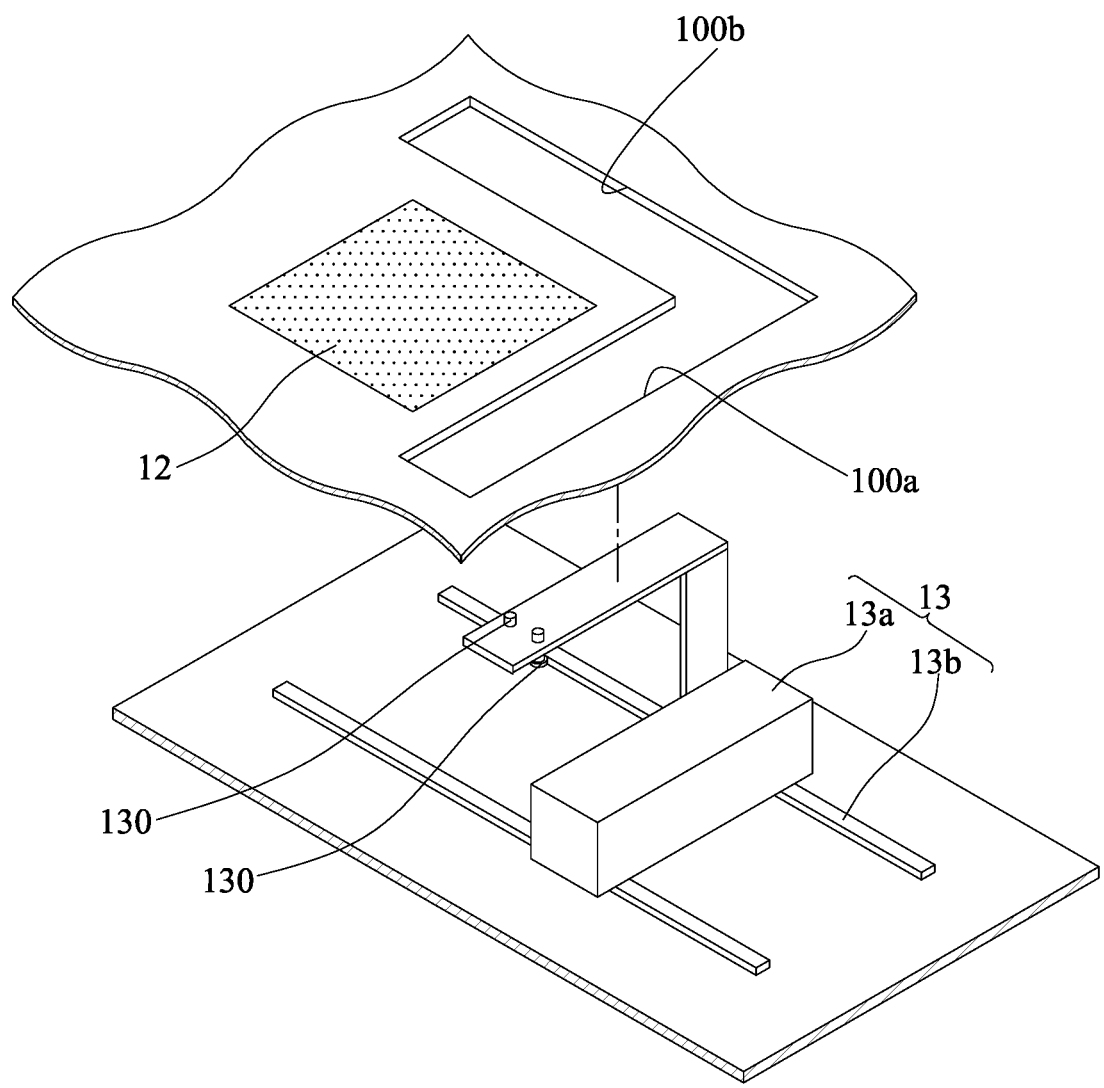
FIG. 1E is a perspective view of a portion of an automated antenna testing device according to the present disclosure.

The opening 100 adjacent to an edge of the carrying stand 12, and has unparallel first and second channels 100a and 100b in communication with each other. In an embodiment, the opening 100 is L-shaped along the edge of the carrying stand 12 (as shown in FIG. 1D or 1E), or is in a shape of a hoof, an open ring etc.

The active region B is a seamless region without metal therein.

The antenna stand 19 corresponds to the carrying stand 12 and is disposed on a wall surface of the active region B of the cavity part 10, for receiving a signal from the objects-to-be-tested 8 or transmitting a signal to the antenna 9 of the objects-to-be-tested 8.

In an embodiment, the antenna stand 19 is disposed on the upper board 10a (i.e., a top board) and corresponds to the carrying stand 12. In another embodiment, the antenna stand 19 is disposed at a position of the cavity part 10 in any angle direction, depending on the specification of the antenna product.

Figure 3A:
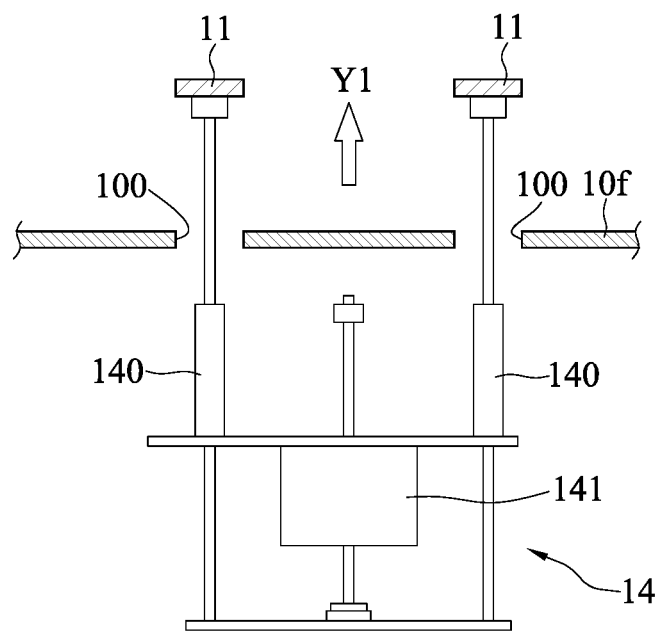
FIGS. 3A and 3B are cross-sectional views of a portion of an automated antenna testing device according to the present disclosure.
Figure 3B:
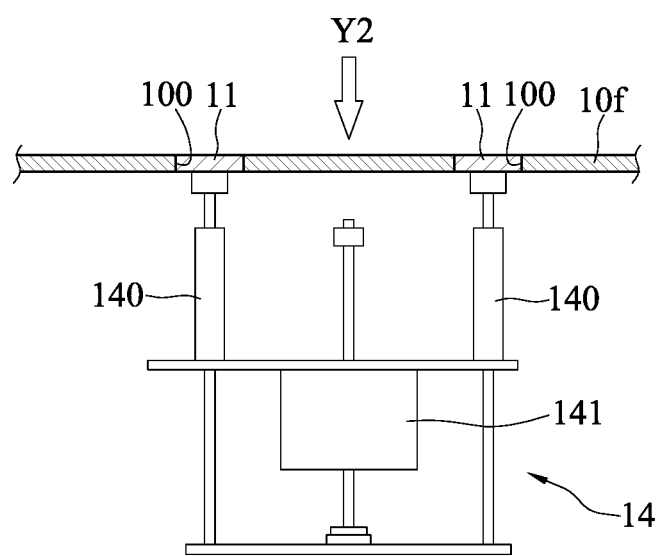

The cover 11 (as shown in FIGS. 1D, 3A and 3B) covers the opening 100, and seals the receiving space S, which is thus closed.

The conveyance device 13 is disposed on the machine part 1a for moving the objects-to-be-tested 8 between the carrying stand 12 and the carrying plate 7 and placing the objects-to-be-tested 8 on the carrying stand 12 or on the carrying plate 7 on demands. The conveyance device 13 and the cavity part 10 are arranged independently.

In an embodiment, the conveyance device 13 comprises a track 13b disposed on the machine part 1a, and a robotic arm 13a configured for picking and placing the objects-to-be-tested 8 on the carrying stand 12. The robotic arm 13a absorbs and secures the objects-to-be-tested 8, and then moves the objects-to-be-tested 8. In an embodiment, the robotic arm 13a comprises a plurality of picking and placing parts 130 configured for absorbing and securing the objects-to-be-tested 8, and the track 13b is disposed between the opening 100 and the carrying plate 7, allowing the robotic arm 13a to move along a straight line between the opening 100 and the carrying plate 7 and access the cavity part 10 through the opening 100. In another embodiment, the conveyance device 13 absorbs and secures the objects-to-be-tested 8, and the picking and placing parts 130 are sucking discs or other suitable structures.

The first channel 100a is used for allowing the robotic arm 13a of the conveyance device 13 to access the cavity part 10 (e.g., upward and downward, as shown in FIGS. 1C and 1E), and the second channel 100b is used for allowing the conveyance device 13 to move in the cavity part 10 (e.g., horizontally, as shown in FIGS. 1D and 1E).

In the automated antenna testing device 1, the active region B of the cavity part 10 and the conveyance device 13 are disposed separately, and the cavity part 10 is an independent mechanism. Therefore, no metal or other objects that will interfere the testing will be within the active region B during the testing operation.

The conveyance device 13 enters the cavity part 10 through the opening 100 (below) of the inactive region A, and the opening 100 of the cavity part 10 corresponding to the conveyance device 13 adjacent to the inactive region A, without being adjacent to the active region B. Therefore, the active region B, in which the testing is conducted, is a seamless space and signals will not be lost.

Figure 4:
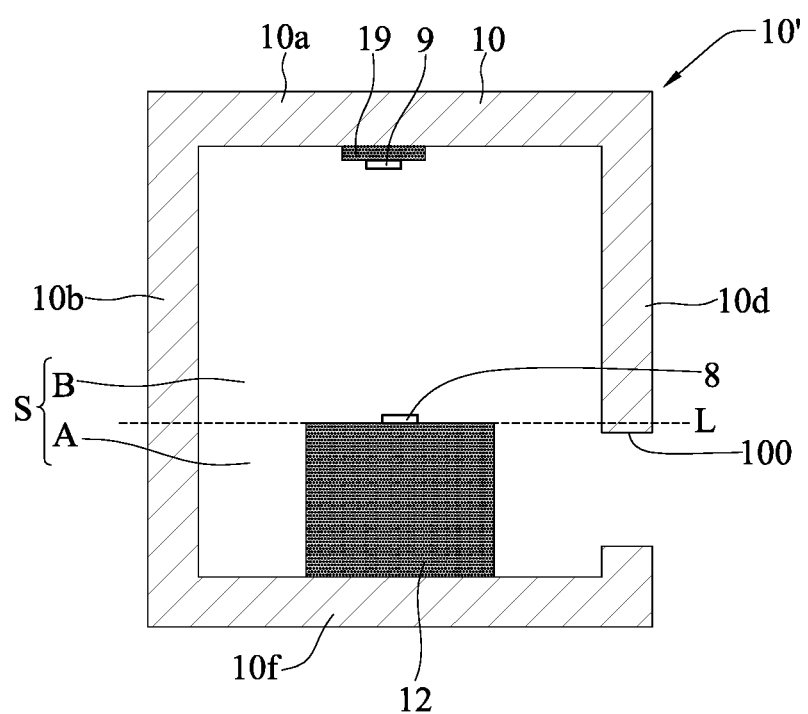
FIG. 4 is a schematic diagram of another aspect of FIG. 1C.

The conveyance device 13 accesses the opening 100 of the cavity part 10 at a position corresponding to where the carrying stand 12 is disposed. In an embodiment, any position corresponding to the base surface L and being away from the active region B will do, e.g., any position within the inactive region A. As shown in FIG. 4, since the inactive region A and the active region B are defined by the base surface L, the cavity part 10' can be designed on demands, in which the opening 100 is formed at a position of the right-hand side board 10d corresponding to the inactive region A, and the carrying stand 12 is disposed on the lower board 10f. In another embodiment, the inactive region A or the opening 100 can be disposed at either side of the cavity part.

The actuation device 14 (as shown in FIGS. 3A and 3B) is disposed outside of the cavity part 10, e.g., on the machine part, to move the cover 11, allowing the cover 11 to be engaged with or separated from the opening 100.

In an embodiment, the actuation device 14 comprises at least one pneumatic component 140, such as an air cylinder, to move the cover 11 to be close to or away from the opening 100. In an embodiment, the pneumatic component 140 provides a first force (in a first direction Y1 shown in FIG. 3A) to raise the cover 11 with respect to the bottom board 10f and separate the cover 11 from the opening 100, and, through a recovery mechanism of the air cylinder, lowers the cover 11 slowly to allow the cover 11 to be engaged with the opening 100 (as shown in FIG. 3B). In another embodiment, in consideration of scheduling of the automatic production lines, the pneumatic component 140 is a two-way air cylinder, which can provide a second force (in a second direction Y2 shown in FIG. 3B), to speed up downward speed of the cover 11. Therefore, the time for the testing operation is reduced significantly.

The pneumatic component 140 is disposed corresponding in position to the opening 100. In an embodiment, the pneumatic component 140 is disposed at two opposite ends of the opening 100, as shown in FIG. 1D. In an embodiment, the L-shaped opening 100 has a straight line segment, through which the robotic arm 13a ascends and enters the receiving space S of the cavity part 10, and a transverse segment, in which a moving space provides the robotic arm 13a to pick and place the objects-to-be-tested 8 in the cavity part 10.

Figure 2A:
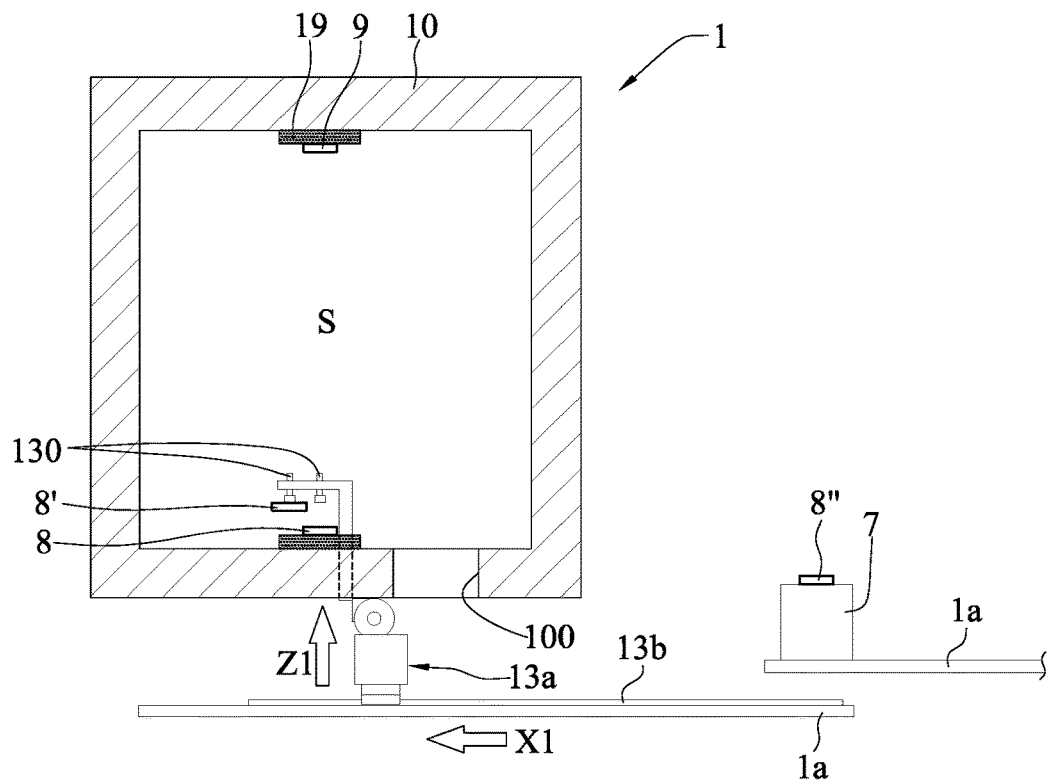
FIGS. 2A to 2D are cross-sectional views illustrating an operation process of an automated antenna testing device according to the present disclosure.
Figure 2B:
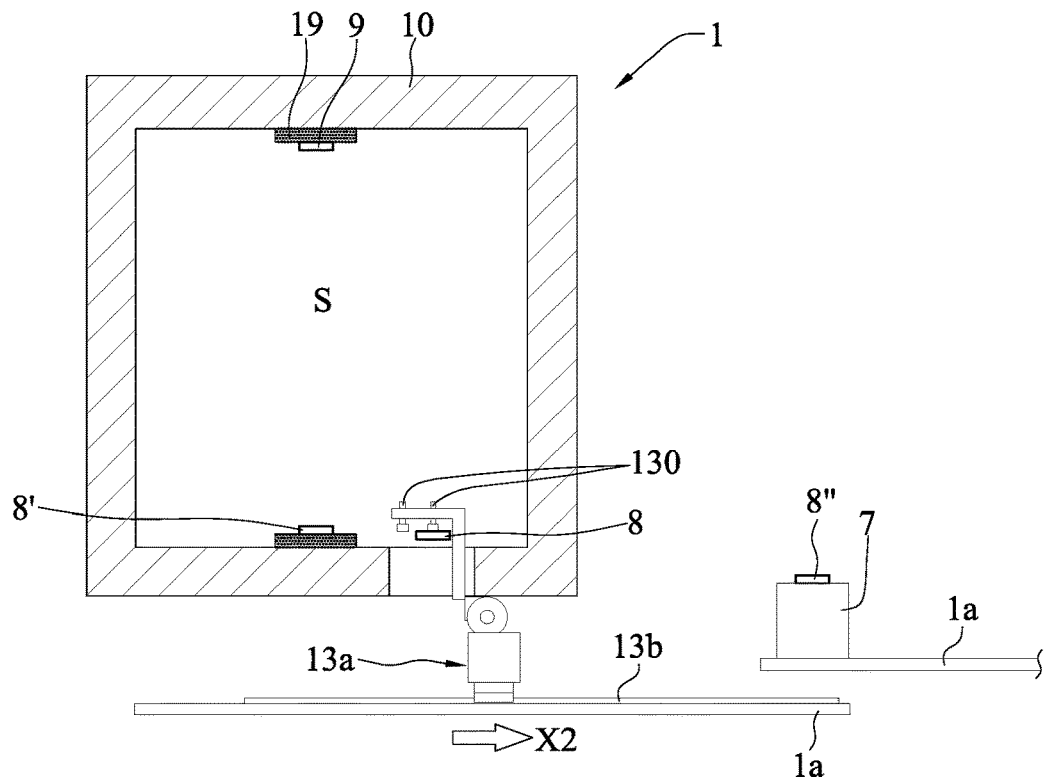
Figure 2C:
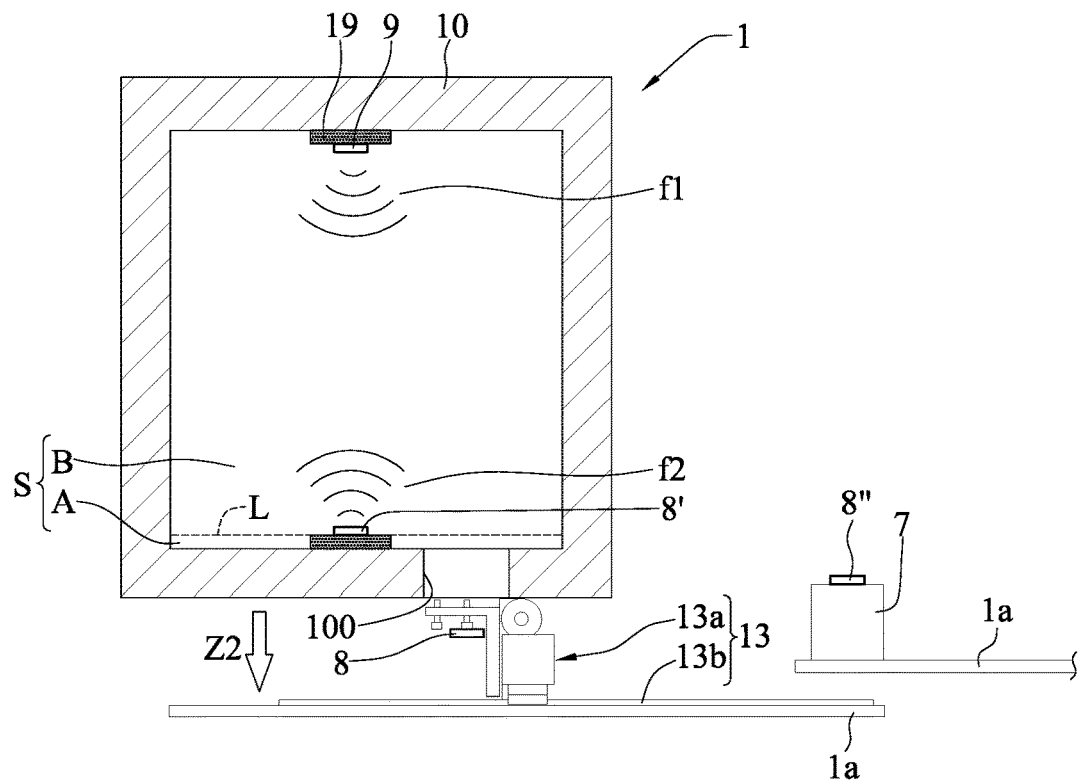

Refer to FIGS. 2A to 2D. During operation of the automated antenna testing device 1, the robotic arm 13a moves along the track 13b to the carrying plate 7, one of the picking and placing parts 130 absorbs one of the objects-to-be-tested 8', and then the robotic arm 13a moves along the track 13b to a region under the opening 100 (in a moving direction X1 shown in FIG. 2A). Then, the actuation device 14 moves the cover 11 upward, allowing the cover 11 to be separated from the opening 100, while the picking and placing parts 130, through the robotic arm 13a, move upward (in a moving direction Z1 shown in FIG. 2A) to the receiving space S, and stretch horizontally with respect to the bottom board 10f (or rotate horizontally with respect to the surface of the bottom board 10f), to place the objects-to-be-tested 8' on the carrying stand 12 (as shown in FIG. 2B). Then, the picking and placing parts 130 move along the track 13b to the opening 100 (in a moving direction X2 shown in FIG. 2B) and move downward and outside of the receiving space S (in a moving direction Z2 shown in FIG. 2C), while the actuation device 14 moves the cover 11 to move downward and be engaged with the opening 100, and the pneumatic component 140 moves out of the receiving space S to conduct a testing operation, such as sensing the antenna signals f1 and f2 between the antenna 9 on the antenna stand 19 and the objects-to-be-tested 8' on the carrying stand 12 shown in FIG. 2C.

The conveyance device 13 and the actuation device 14 actuate synchronously. Therefore, the working time is reduced, the operation efficiency of the testing process is increased, and the overall time spent in the packaging and testing process is reduced significantly.

Figure 2D:
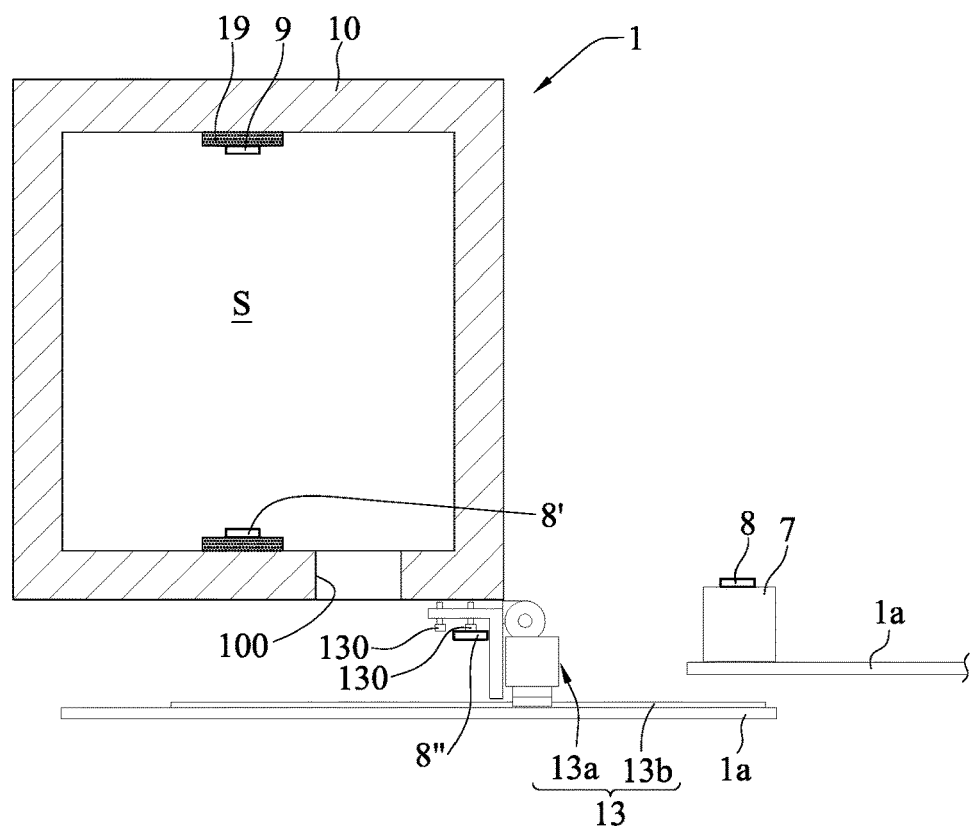

In an embodiment, if an object-to-be-tested 8 that is tested completely is placed on the carrying stand 12, as shown in FIG. 2A, another of the picking and placing parts 130 of the robotic arm 13a can absorb and move the object-to-be-tested 8 that is tested completely onto the carrying plate 7, as shown in FIG. 2D, and absorb another object-to-be-tested 8". After the robotic arm 13a enters the cavity part 10, the placement of the objects-to-be-tested 8', 8", which are not tested yet, and the picking of the objects-to-be-tested 8, which are tested completely, can be conducted subsequently, as shown in FIGS. 2A to 2D. Therefore, the working time is reduced, the operation efficiency of the testing process is increased, and the overall time spent in the packaging and testing process is reduced significantly.

After the OTA testing operation of the objects-to-be-tested 8' is complete, the conveyance device 13 picks and places the objects-to-be-tested 8' on the carrying plate 7, and places another objects-to-be-tested 8" on the carrying stand 12.

In the automated antenna testing device 1 according to the present disclosure, the cavity part 10, 10' and the conveyance device 13 are disposed independently. Therefore, other components associated with automatic design (not shown) in the automated antenna testing device 1 will not interfere the OTA testing environment, the automatic OTA testing is achieved, and the yield is increased. The conveyance device 13 or the cavity part 10, when malfunctioned, can be detached individually, to facilitate the replacement operation.

In the automated antenna testing device 1 according to the present disclosure, both the conveyance device 13 and the actuation device 14 access the cavity part 10 through the opening 100 of the inactive region A, and the conveyance device 13 and the actuation device 14 are outside the cavity part 10 when the antenna is tested, no metal or other objects that will interfere the testing of the antenna will exist when the antenna is tested within the active region B, which is a seamless space. Therefore, the testing of the antenna will not be interfered.

In an embodiment, any type of antenna devices disposed on the antenna stand 19 and objects-to-be-tested 8 corresponding thereto can be arranged on demands, and a desired testing can be conducted, in addition to the previously mentioned OTA testing operation.

The foregoing descriptions of the detailed embodiments are only illustrated to disclose the features and functions of the present disclosure and not restrictive of the scope of the present disclosure. It should be understood to those in the art that all modifications and variations according to the spirit and principle in the disclosure of the present disclosure should fall within the scope of the appended claims.

The invention claimed is:

1. An automated antenna testing device, comprising:
a machine part;
a cavity part installed on the machine part and having a receiving space and an opening being in communication with the receiving space, wherein the opening has unparallel first and second channels in communication with each other;
a carrying stand installed in the receiving space for objects-to-be-tested to be carried thereon;
an antenna stand installed in the receiving space and corresponding to the carrying stand for an antenna to be installed thereon, the antenna receiving a signal from the objects-to-be-tested or transmitting a signal to the objects-to-be-tested; and
a conveyance device installed on the machine part and configured for moving the objects-to-be-tested to the carrying stand,
wherein the conveyance device and the cavity part are installed independently.

2. The automated antenna testing device of claim 1, further comprising an active region between the carrying stand and the antenna stand in the receiving space.

3. The automated antenna testing device of claim 2, wherein the active region is a seamless region.

4. The automated antenna testing device of claim 1, wherein the conveyance device comprises a robotic arm configured for picking and placing the objects-to-be-tested on the carrying stand.

5. The automated antenna testing device of claim 4, wherein the robotic arm absorbs and secures the objects-to-be-tested to move the objects-to-be-tested.

6. The automated antenna testing device of claim 5, wherein the conveyance device comprises a plurality of picking and placing parts disposed on the robotic arm.

7. The automated antenna testing device of claim 6, wherein the robotic arm drives one of the picking and placing parts to absorb one of the objects-to-be-tested to leave the carrying stand, and drives another one of the picking and placing parts to place another one of the objects-to-be-tested on the carrying stand.

8. The automated antenna testing device of claim 1, wherein the cavity part is closed.

9. The automated antenna testing device of claim 2, further comprising an inactive region defined to be adjacent to the active region in the receiving space.

10. The automated antenna testing device of claim 9, wherein the corresponds to the inactive region, allowing the conveyance device to access the cavity part therethrough.

11. The automated antenna testing device of claim 1, wherein the conveyance device accesses the cavity part through the first channel, and the second channel allows the conveyance device to move in the cavity part.

12. The automated antenna testing device of claim 10, further comprising a cover configured for covering the opening.

13. The automated antenna testing device of claim 12, further comprising an actuation device installed outside the cavity part and connected to the cover.

14. The automated antenna testing device of claim 13, wherein the actuation device is configured for moving the cover.

15. The automated antenna testing device of claim 14, wherein the actuation device comprises at least one pneumatic component connected to the cover and configured for moving the cover close to or away from the opening.

16. The automated antenna testing device of claim 2, wherein the active region of the cavity part is free from including metal.

* * * * *